(12) United States Patent
Taylor et al.

(10) Patent No.: US 8,413,833 B1
(45) Date of Patent: Apr. 9, 2013

(54) RUGGEDIZED COMPOSITE RACK MOUNT TRANSPORT CASE

(75) Inventors: Alan Taylor, Palmetto, FL (US); David Root, Lutz, FL (US)

(73) Assignee: TCF Composites, LLC, Palmetto, FL (US)

( * ) Notice: Subject to any disclaimer, the term of this patent is extended or adjusted under 35 U.S.C. 154(b) by 126 days.

(21) Appl. No.: 13/089,929

(22) Filed: Apr. 19, 2011

Related U.S. Application Data

(60) Provisional application No. 61/379,982, filed on Sep. 3, 2010.

(51) Int. Cl.
  B65D 45/00 (2006.01)
  B65D 51/12 (2006.01)
  B65D 45/32 (2006.01)
  B65D 6/00 (2006.01)

(52) U.S. Cl.
  USPC ........... 220/315; 220/305; 220/320; 220/675; 361/679.58; 361/725; 361/726

(58) Field of Classification Search .................. 220/315, 220/305, 320; 361/679.58, 725–726
  See application file for complete search history.

(56) References Cited

U.S. PATENT DOCUMENTS

| | | | |
|---|---|---|---|
| 4,741,972 A | 5/1988 | Hardigg | |
| 4,998,636 A | 3/1991 | Hardigg | |
| D327,646 S | 7/1992 | Hardigg et al. | |
| 5,370,254 A | 12/1994 | Hardigg et al. | |
| D357,180 S | 4/1995 | Stover | |
| 5,416,284 A | 5/1995 | Steele et al. | |
| 5,808,866 A | 9/1998 | Porter | |
| 5,873,480 A | 2/1999 | Wells, Jr. | |
| 6,158,745 A | 12/2000 | Deighton | |
| D439,407 S | 3/2001 | Parker | |
| 6,203,075 B1 | 3/2001 | Wells, Jr. et al. | |
| D441,954 S | 5/2001 | Parker | |
| D462,519 S | 9/2002 | Gaydos et al. | |
| D464,196 S | 10/2002 | Parker | |
| D465,330 S | 11/2002 | Parker | |
| D467,424 S | 12/2002 | Hardigg et al. | |
| D467,425 S | 12/2002 | Hardigg et al. | |
| D467,426 S | 12/2002 | Hardigg et al. | |
| 6,622,881 B2 | 9/2003 | Hardigg | |
| D482,529 S | 11/2003 | Hardigg et al. | |
| 6,698,608 B2 | 3/2004 | Parker et al. | |
| 6,953,126 B2 | 10/2005 | Parker et al. | |
| 6,955,381 B2 | 10/2005 | Parker et al. | |
| D523,242 S | 6/2006 | Hardigg et al. | |
| D530,917 S | 10/2006 | Conforti | |
| 7,312,984 B2 | 12/2007 | Richardson et al. | |

(Continued)

Primary Examiner — J. Gregory Pickett
Assistant Examiner — James M Van Buskirk
(74) Attorney, Agent, or Firm — Charles J. Prescott

(57) ABSTRACT

A ruggedized case for transportation and protection of electronic equipment used in harsh commercial or military environments. The ruggedized case is 30-70% lighter than other similar competing cases through the use of lightweight, low-density, superior strength composite materials. The ruggedized case includes a multi-panel case body open at each end and two removable covers. A chassis which may be vibration and shock isolated, and a removable rack mount frame are also provided. Each component of this ruggedized case, including recessed cover latches, and handles, weather and airtight seals, adjustable rack mount frame lock mechanisms, and vibration isolators, have been significantly improved to provide more ergonomic form and functionality.

10 Claims, 28 Drawing Sheets

U.S. PATENT DOCUMENTS

| | | |
|---|---|---|
| 7,533,782 B2 | 5/2009 | Parker et al. |
| 7,537,119 B2 | 5/2009 | Becklin |
| 7,724,513 B2 | 5/2010 | Coglitore et al. |
| 2006/0289470 A1 | 12/2006 | Sprague et al. |
| 2007/0245651 A1 | 10/2007 | Hardigg et al. |
| 2009/0178946 A1 | 7/2009 | Patstone et al. |
| 2009/0200300 A1 | 8/2009 | Parker et al. |

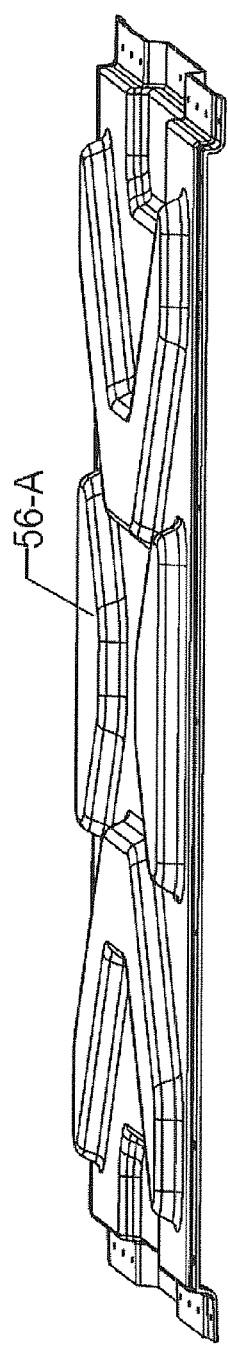

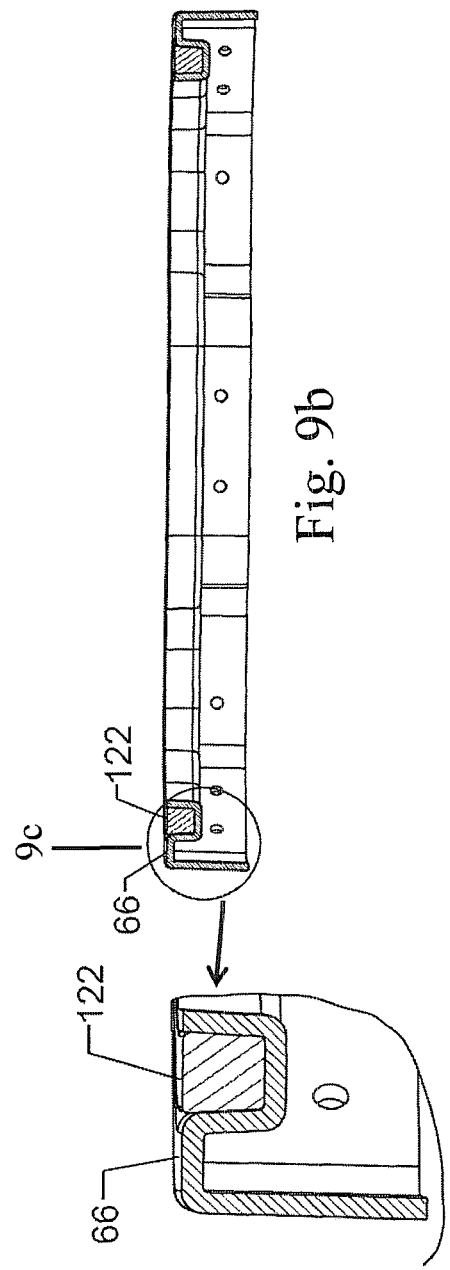

RUGGEDIZED COMPOSITE RACK MOUNT TRANSPORT CASE

CROSS-REFERENCE TO RELATED APPLICATIONS

Not applicable

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND OF THE INVENTION

1. Field of the Invention

This invention relates generally to container systems for commercial and military packaging which protect electronic equipment against damage caused by shipping and other rough handling, and more particularly to a ruggedized container system for housing and environmental isolation of sensitive electronic equipment utilizing lightweight superior strength composite structural materials and unique component designs for superior weight reduction, functionality, and longevity.

2. Description of Related Art

Electronic equipment of the type typically used in commercial or military environments has not been designed to withstand extreme military transport, high impact or shock environment. Therefore, a variety of reinforced and ruggedized container systems have been developed to protectively house and transport electronic equipment. One such system is disclosed in U.S. Pat. No. 5,808,866 invented by Porter bearing these design goals and attributes.

A company called ECS Case located in Grants Pass, Oreg., manufactures and distributes ECS composite rack mount cases which include removable shock mounted aluminum racks, scoveres and quick release fasteners, composite center bodies and composite removable covers. Although being commercially viable, ECS rack mount cases are lacking structural and component sophistication.

Hardigg Industries of South Deerfield, Mass. also manufactures and distributes a line of rotomolded plastic rack mount containers designed to protect house and transport sensitive electronic equipment mounted therein. While these HARDIGG containers meet all of the environmental requirements and federal test method standards, nonetheless the overall size, weight and bulkiness, lack of sophistication of manufacturing techniques, and various other component and accessory functionality leave much to be desired from this product line.

The commercial off-the-shelf transportation cases are typically not intended for use in the harsh military environment. The requirements of military transit cases are lightweight, crush proof, stackable, air and water tight, and securely transportable for harsh environments particularly environments characterized by high vibration/shock levels, rough shipping and handling and temperature extreme. The weight of the case used in military environment may be critical, for example, in a battlefield where the electronics package should be sufficiently light to be transported and placed in a selected position by at most two persons. In addition, it is very important to build into these containers a shock mitigation system which is capable of protecting sensitive electronic equipment from possible damages during harsh transport.

The present invention addresses all of the needs currently unmet by the so-called lightweight, superior strength ruggedized enclosures for protecting housings and transporting sensitive electronic equipment and modules subjected to a harsh environment of severe vibration and physical impact, corrosive atmosphere and temperature extremes. Several embodiments of both overall case structure and component features, along with manufacturing methodology are disclosed. The net effect of this disclosure is to provide an extremely light, highly sophisticated and superior strength ruggedized enclosure better suited for protecting, housing, and transporting environmentally sensitive electronic equipment particularly use in military settings.

PATENTED PRIOR ART

U.S. Pat. No. 4,741,972 to Hardigg
U.S. Pat. No. 4,998,636 to Hardigg
U.S. Pat. No. 5,370,254 to Hardigg et al.
U.S. Pat. No. 5,416,284 to Steele et al.
U.S. Pat. No. 5,808,866 to Porter
U.S. Pat. No. 5,873,480 to Wells, Jr.
U.S. Pat. No. 6,158,745 to Deighton
U.S. Pat. No. 6,203,075 to Wells, Jr. et al.
U.S. Pat. No. 6,622,881 to Hardigg
U.S. Pat. No. 6,698,608 to Parker et al.
U.S. Pat. No. 6,953,126 to Parker et al.
U.S. Pat. No. 6,955,381 to Parker et al.
U.S. Pat. No. 7,312,984 to Richardson et al.
U.S. Pat. No. 7,533,782 to Parker et al.
U.S. Pat. No. 7,724,513 to Coglitore et al.
U.S. Patent Application Publication 2006/0289470 to Sparague et al.
U.S. Patent Application Publication 2007/0245651 to Hardigg et al.
U.S. Patent Application Publication 2009/0178946 to Patstone et al.
U.S. Patent Application Publication 2009/0200300 to Parker et al.
U.S. Design Pat. D327,646 to Hardigg
U.S. Design Pat. D357,180 to Stover
U.S. Design Pat. D439,407 to Parker
U.S. Design Pat. D441,954 to Parker
U.S. Design Pat. D462,519 to Gaydos et al.
U.S. Design Pat. D464,196 to Parker
U.S. Design Pat. D465,330 to Parker
U.S. Design Pat. D467,424 to Hardigg et al.
U.S. Design Pat. D467,425 to Hardigg et al.
U.S. Design Pat. D467,426 to Hardigg et al.
U.S. Design Pat. D482,529 to Hardigg et al.
U.S. Design Pat. D523,242 to Hardigg et al.
U.S. Design Pat. D530,917 to Conforti The foregoing examples of the related art and limitations related therewith are intended to be illustrative and not exclusive. Other limitations of the related art will become apparent to those skilled in the art upon a reading of the specification and a study of the drawings.

BRIEF SUMMARY OF THE INVENTION

This invention is directed to a ruggedized case for transportation and protection of electronic equipment used in hash commercial or military environments. The ruggedized case is 30-70% lighter than other similar competing cases through the use of lightweight, low-density, superior strength composite materials. The ruggedized case includes a multi-panel case body open at each end and two removable covers. A chassis which may be vibration and shock isolated, and a removable rack mount frame are also provided. Each component of this ruggedized case, including recessed cover latches, and handles, weather and airtight seals, adjustable rack mount frame lock mechanisms, and vibration isolators, have been significantly improved to provide more ergonomic form and functionality. This construction is also non-deforming under temperature extremes, chemical resistant, robust stacking characteristics integrated into the case body itself. The preferred materials and processing methodology incorporate continuous carbon fiber reinforced thermoplastics from either Bond Laminates GMBH or Schappe Technique of France.

A beneficial feature of the ruggedized transit case of this invention is lightweight. The present design will be 30-70% lighter than any other similar cases through the use of lightweight, low-density structural composite materials. In this invention, the density of the continuous carbon fiber reinforced thermoplastic materials will be approximately 0.05896 lbm/in$^3$ which translates into nearly a 50% weight savings over aluminum while providing far greater design flexibility and substantially increasing the structural rigidity of the enclosure components.

Since continuous carbon fiber reinforced composite materials exceed the structural properties of aluminum in the same thickness, part thickness is decreased thereby reducing the weight even further. Enclosure wall thicknesses will be up to 0.25" thinner than those of roto-molded competitors' products. Composite to composite bonding or joining of components may be done through traditional methods such as by gaskets and fasteners, structural glue or epoxy, ultrasonic welding, vibration welding, in-situ molding processes, co-molding, or two shot molding.

It is an object of the present invention to provide a removable rack mount frame for a case, which is capable of supporting electronic equipment and modules within the case to prevent damage caused by impacts and vibration.

It is another object of the present invention to provide a rotation lock mechanism for a case wherein the removable frame is retained to the chassis by dual rotation lock mechanisms at both sides of the enclosure visible only when the top or bottom wall is off; the lock mechanism can be rotated, therefore releasing and relocking the removable frame in multiple indexed positions and also allowing secure access to the suspended electronics without complete removal from the transit case.

It is another object of the present invention to provide recessed cover latches for a case which sit flush when not in use with no sharp edges capable of cutting or snagging a passerby. The recessed latch permits rapid opening of the sealed cased and rapid reinstallation and resealing of cover to the case body.

It is another object of the present invention to provide spring loaded handles for a case which are ergonomically designed to allow swiveling on axis up to 180° and rotating outward from a flush recess to a 90° position, and automatic rotating back to a non-use position once released from use. Articulating handles facilitate maneuvering of the case through tight openings while the ergonomic design allows for enhanced management of centers of gravity.

It is another object of the present invention to provide an improved means for sealingly connecting the outer panels together mechanically to form a sealed interior volume of the housing assembly.

It is another object of the present invention to provide a weight reduced chassis that includes eight shock absorbers symmetrically positioned between the framework of the chassis assembly and the wall of the ruggedized case, wherein the shock absorber is located in a 45° orientation at each one of 8 corner locations.

It is still another object of the present invention to use light-weight, superior strength composite materials to fabricate the case, all panels being constructed from high pressure compression molded polymer composite, which consists of 70~30% by volume continuous carbon fiber, and 30~70% by volume PA 6,6 resin.

The instant invention is further described with reference to the accompanying drawings. Other features and the advantages of the invention will be apparent from the following detailed description of the preferred embodiment.

The following embodiments and aspects thereof are described and illustrated in conjunction with systems, tools and methods which are meant to be exemplary and illustrative and not limiting in scope. In various embodiments one or more of the above-described problems have been reduced or eliminated while other embodiments are directed to other improvements. In addition to the exemplary aspects and embodiments described above, further aspects and embodiments will become apparent by reference to the drawings and by study of the following descriptions.

BRIEF DESCRIPTION OF THE SEVERAL VIEWS OF THE DRAWING(S)

FIG. 2b is a bottom plan view of FIG. 2a.

FIG. 2c is an exploded perspective view of FIG. 2a.

FIG. 3b is an exploded view of FIG. 3a.

FIG. 4a is a top plan view of the cover parting bracket 48 and blade 50 of FIG. 2a.

FIG. 4b is a broken side perspective view of FIG. 4a.

FIG. 6a is a perspective view of panel 56-A.

FIG. 8b is a lower perspective view of FIG. 8a.

FIG. 9b is a broken side perspective view of FIG. 9a.

FIG. 9c is an enlarged view of area 9c in FIG. 9b.

FIG. 10a is a vertical section view of FIG. 1.

FIG. 10b is an enlarged view of area 10b in FIG. 10a.

FIG. 11a is a perspective view of the removable rack mount frame 70.

FIG. 11b is an enlargement of area 11b in FIG. 11a.

FIG. 11c is an enlargement of area 11c in FIG. 11a.

FIG. 11d is an exploded perspective view of FIG. 11a.

Figure 14A:
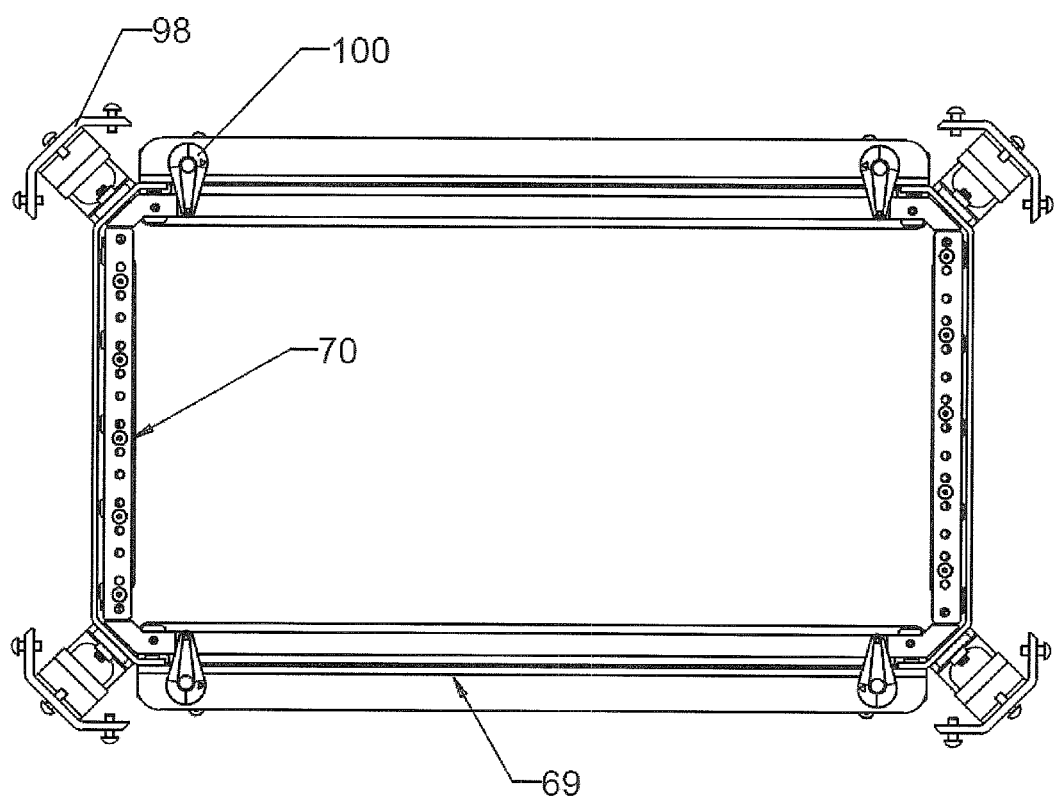

FIG. 14*a* is a top plan view of the chassis 69, removable rack mount frame 70, and lock mechanism 100 and vibration/shock absorber 98.

Figure 14B:
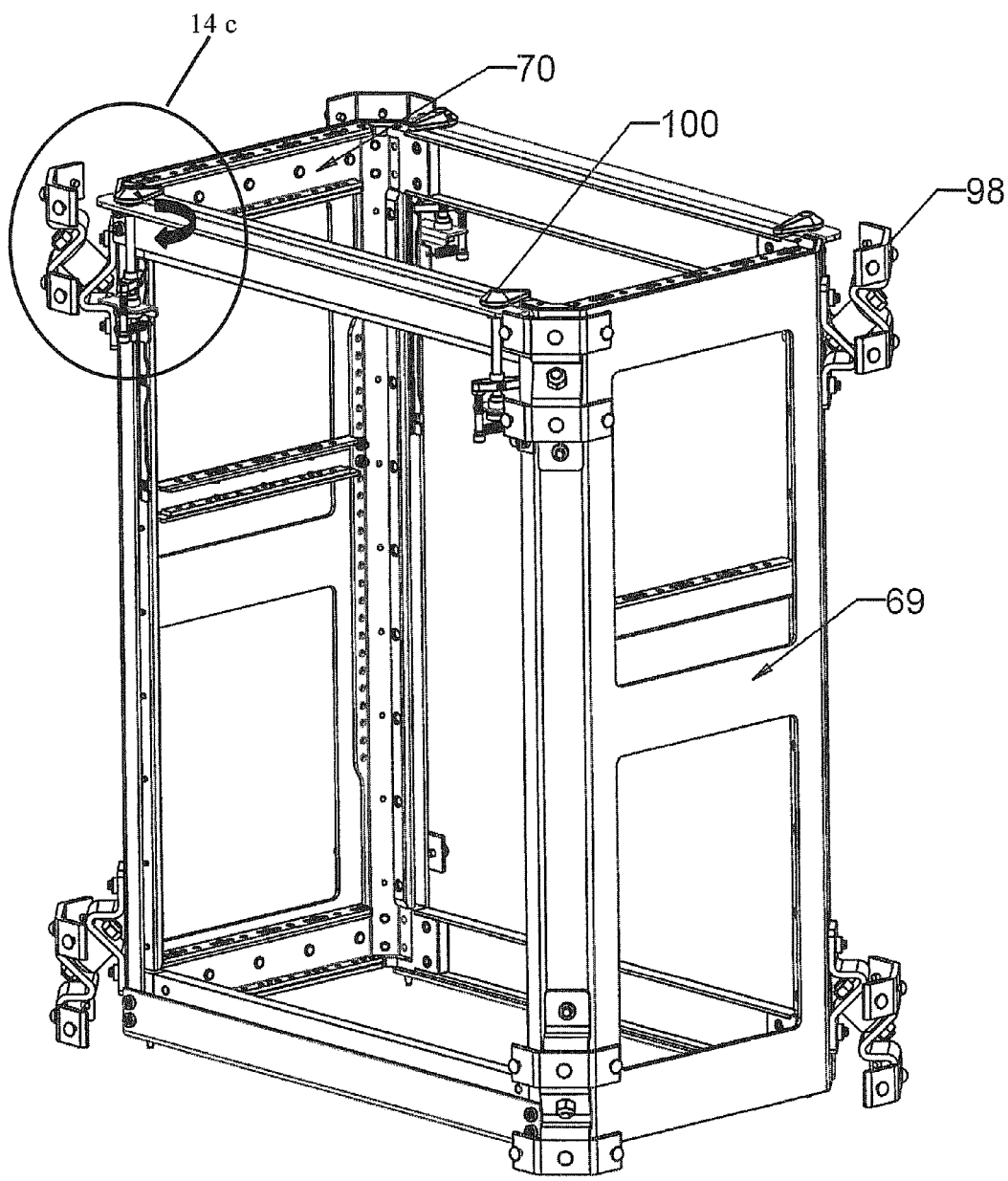

FIG. 14*b* is a perspective view of FIG. 14*a*.

FIG. 14*c* is an enlargement of area 14*c* in FIG. 14*b*.

Figure 14:
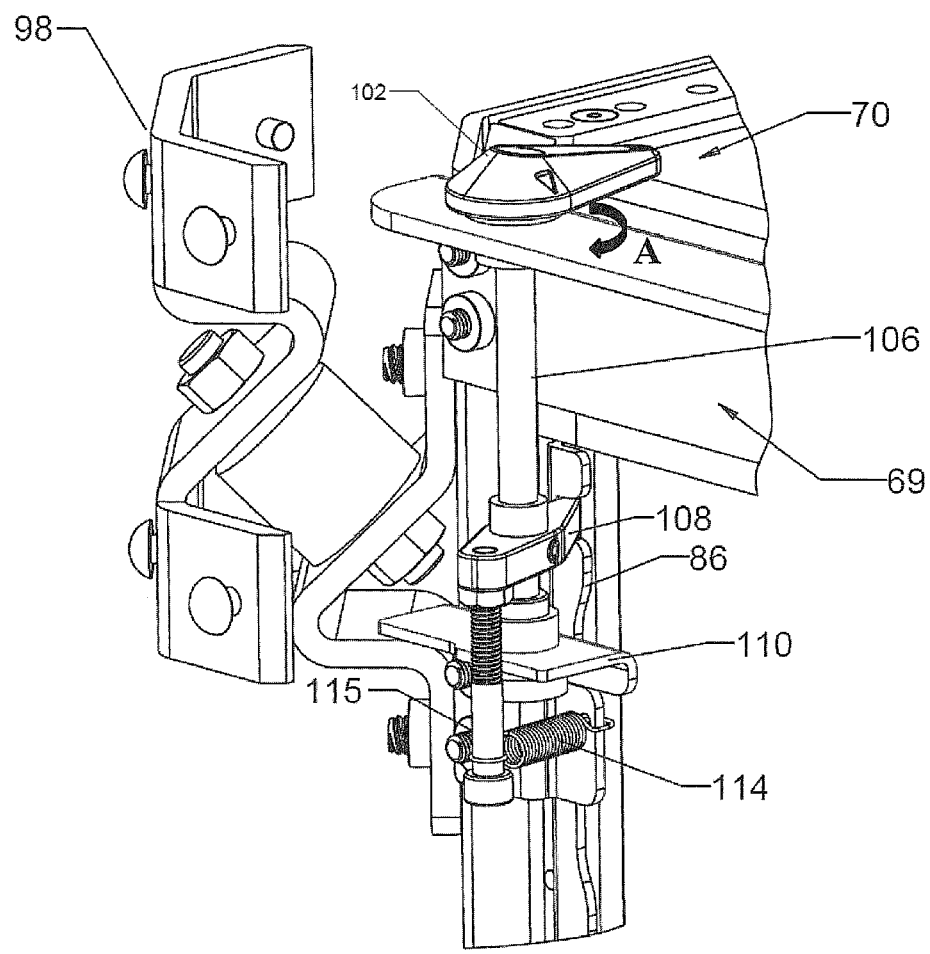
Figure 14D:
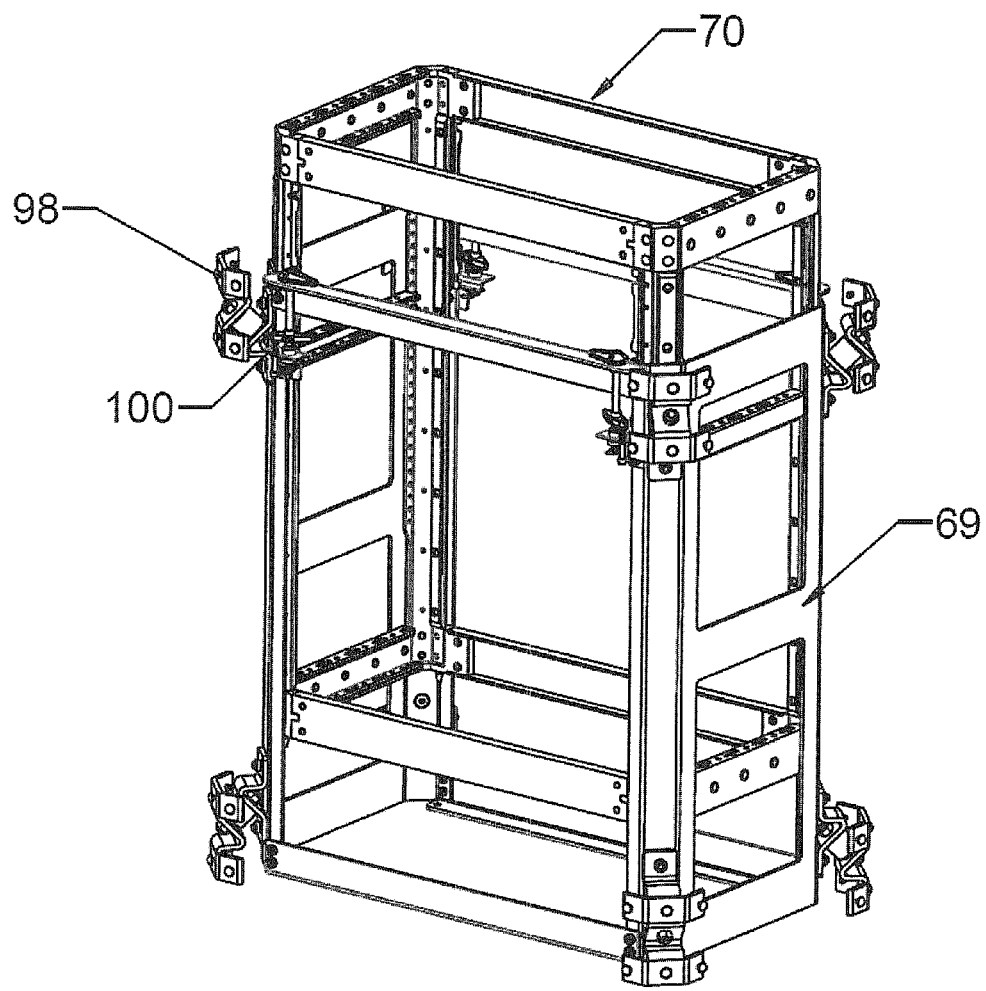

FIG. 14*d* is a view of FIG. 14*a* showing removal of the rack mount frame 70.

Figure 15:
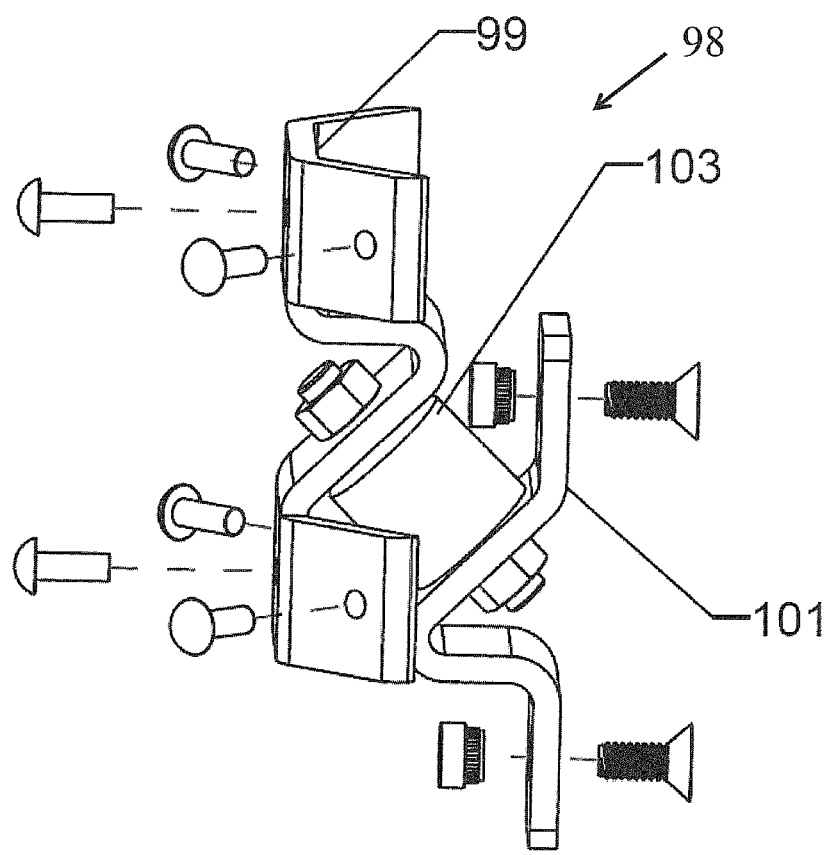

FIG. 15 is a partial exploded perspective view of vibration/shock absorber 98.

Exemplary embodiments are illustrated in reference figures of the drawings. It is intended that the embodiments and figures disclosed herein are to be considered to be illustrative rather than limiting.

DETAILED DESCRIPTION OF THE INVENTION

Figure 1:
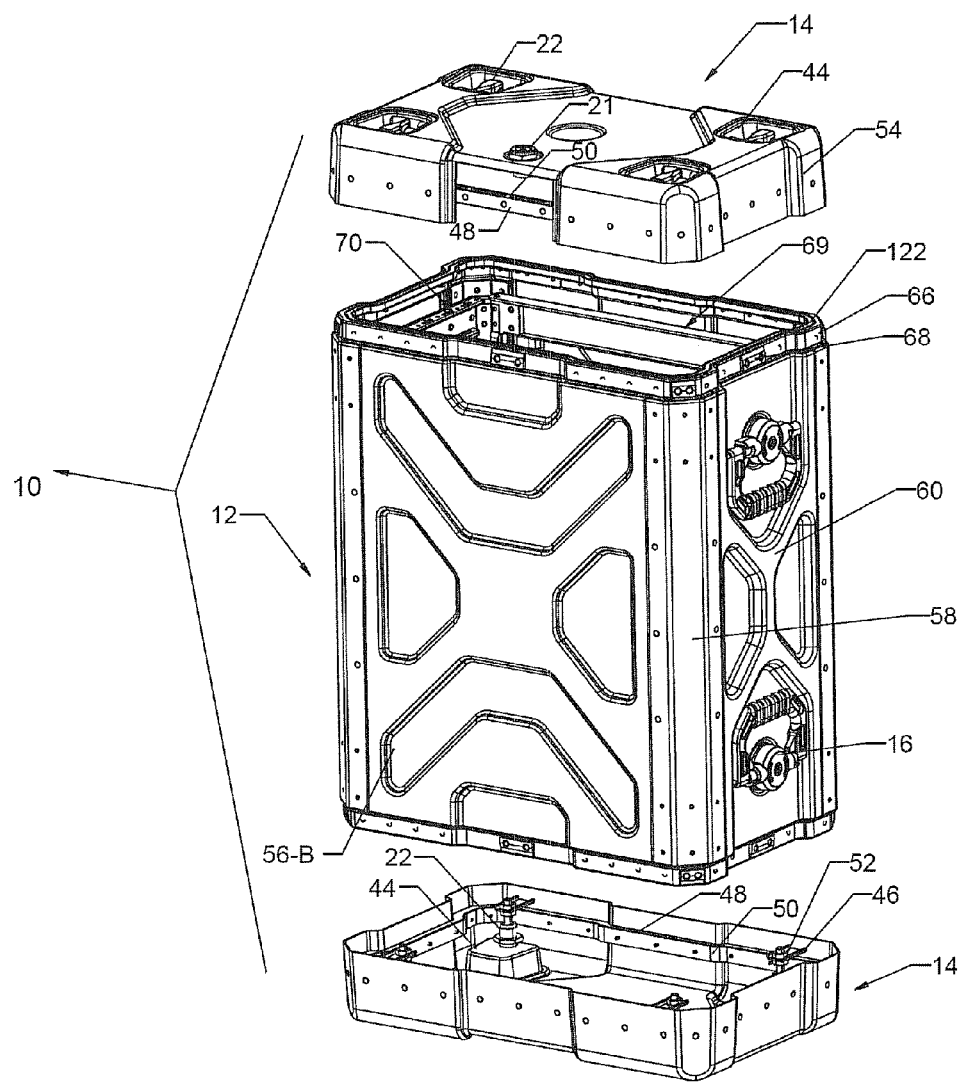
FIG. 1 is a perspective view of the ruggedized composite rack mount transport case 10 according to the invention.

Nomenclature 10. ruggedized case assembly
12. case body
14. removable cover
16. handle
21. air pressure relief valve
22. cover latch
24. T-handle
26. latch cap
28. latch sleeve
32. hex nut
34. spring
36. O-ring
40. latch rivet
42. latch pin
44. recessed cup
46. cam
48. cover parting bracket
50. cover parting blade
52. nut
54. cover panel
56A. panel
56B. panel
58. corner panel
60. side panel
62. plate
64. locker
66. case body parting bracket
68. parting guide
69. chassis
70. rack mount frame
72. frame member
74. corner joint
76. frame slide member
78. C-channel rail
80. slide
82. slide
84. adjustable mounting rail
86. stop bracket
90. steel plate
94. steel plate
98. vibration/shock absorber
99. shock absorber bracket
100. lock mechanism
101. shock absorber bracket
102. lever
103. isolator
104. flange sleeve
106. locker shaft
108. locker
110. pivot bracket lock
112. locking flange
113. jam nut
114. extension spring
115. threaded fastener
122. gasket
126. threaded fastener
128. cartridge bearing
130. rotary housing
132. ferrule
134. spring
136. long rivet
138. small spring
140. center
144. handle base FIG. 1 shows a perspective view of a preferred embodiment at numeral 10 according to the present invention. The ruggedized transit case 10 is preferably formed in the shape of rectangular assembly and constructed from a case body 12 and two removable covers 14. As shown in FIG. 1, the body 12 is formed from the panels 56 A and B, side panels 60 and corner panels 58 which serve to connect the panels 56 and panels 58, and body parting bracket 66, parting guide 68, gasket member 122 and chassis 69 and removable rack mount frame assembly 70. The center body parting line edge is preferably adapted to align with the parting line of the cover, as will be discussed below. The panels 56 A and B are provided with a plurality holes which receive rivets that are used to hold the corner panels 58 in mating engagement with panels 56 and sides panel 60. The surrounding walls of both case body 12 and covers 14 are preferably made of continuous carbon fiber reinforced polyamide 6,6 composite (PA6,6) composites by compression mold techniques.

Case Removable Cover

Figure 2A:
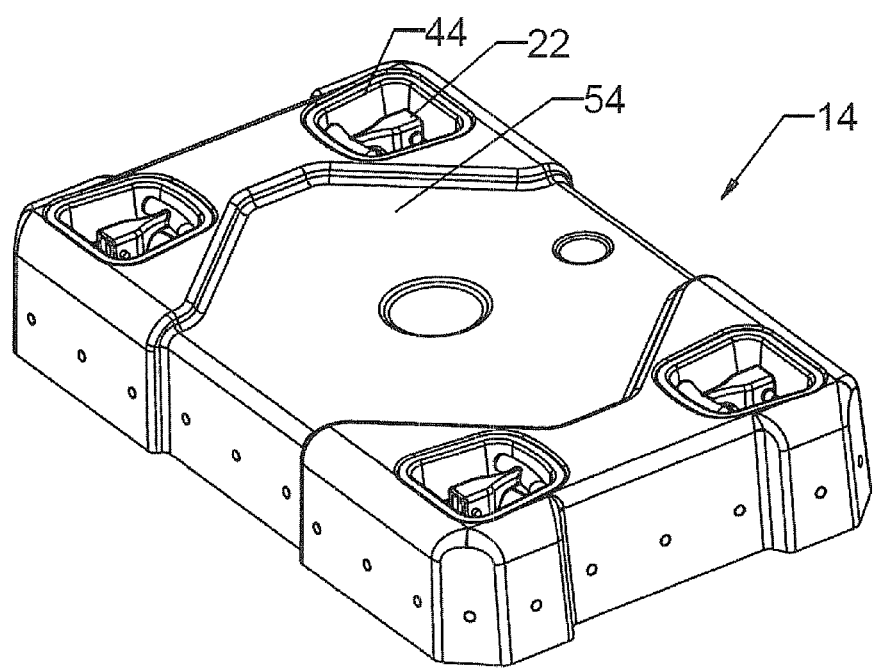
FIG. 2a is a perspective view of the case cover 14 of FIG. 1.
Figure 2B:
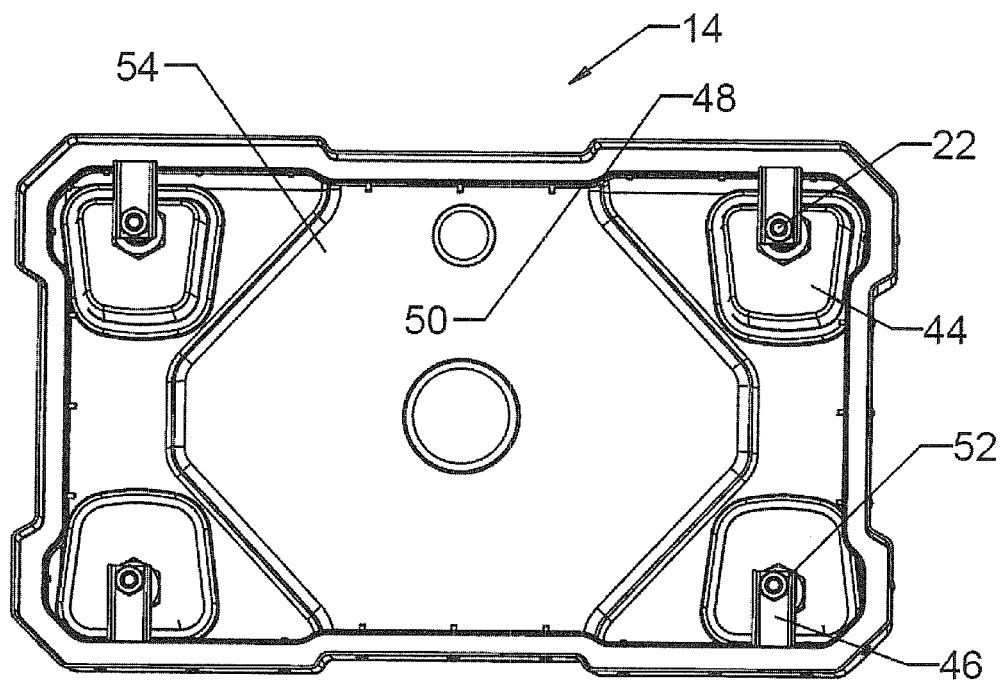
Figure 2C:
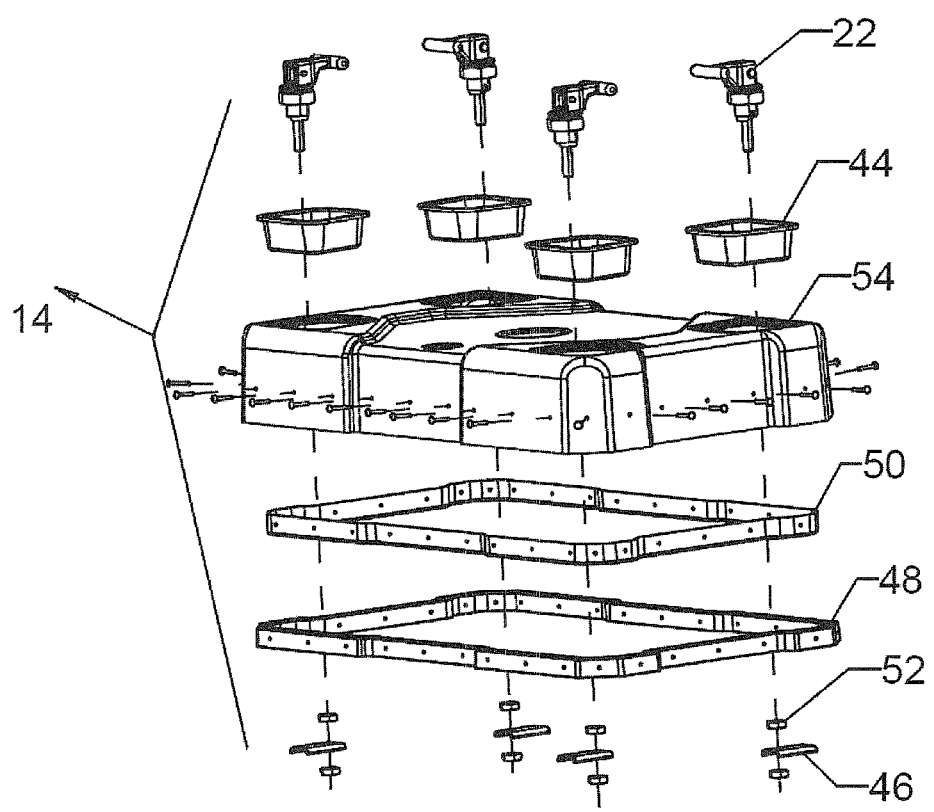

FIGS. 2*a-c* show various views of the removable cover 14. The case covers 14 are removable and comprised of a cover panel 54 having a cover parting bracket 48 and cover parting blade 50. The periphery and surface are made from the same continuous carbon fiber reinforced PA 6,6 composite by compression mold techniques. Four two-stage positive latches 22 are attached to the cover through the recessed cups 44, which are joined to the covers by conventional fasteners, such as structural glue or epoxy (not shown). As shown in FIG. 2*c*, the latch 22 is uniquely implemented to accommodate hands even wearing chemical gloves. A cam 46 is locked onto the end of each latch by two nuts 52. The cover is sealedly attached to the center body 12 through four latches by the interaction between the cam 46 and lockers 64 which are attached to cover parting bracket 48 of the case body 12.

In circumstances which result in the heating of the interior volume by the electronic equipment contained therein or by the increased exterior environmental temperature and which might otherwise cause excess static pressure to build within the interior volume to threaten the integrity of the sealing members of this invention as described previously. A spring loaded air pressure relieve valve 21 is mounted on one surface of the removable cover (see FIG. 1). The valve 21 permits for ingress and egress of the pressure to equilibrate the pressure between the inside and the outside of the case.

Materials/Weight Reduction

The preferred material and processing technique of this design are continuous carbon fiber reinforced polyamide 6, 6 (PA 6,6) composite from either Bond Laminates GMBH or Schappe Technique of France by thermoforming/stamping techniques. The composite is a sandwich structure which includes carbon fiber or carbon fiber combined glass fiber in the structure. The composite material includes 30~70% by volume continuous fiber, and 70~30% by volume PA 6,6 resin.

The thermoplastic resins used in the composites structure are not limited to PA 6,6, but may include polyethylene (PE), polyamide 6 (PA6), polyamide 12 (PA 12), polyimide (PI), polycarbonate (PC), poly(methyl methacrylate) (PMMA), poly (ethyleneterephtatlate) (PET), polypropylene (PP), poly (butylene terephthalate) (PBT), polystyrene (PS), polyurethane (PU), polyacrylonitri (PAN), Acrylonitrile Butadiene Styrene (ABS) and so on.

Composites preferred are selected from the group of composites comprising essentially continuous carbon fiber, carbon fiber reinforced thermoplastics; and combinations thereof. The process used for the manufacturing of the case panels and covers is thermostamp molding at a pressure of 1000~4000 psi; the processing temperature is at a temperature above the melting point of the polymer. The carbon fiber reinforced thermoplastics are heated to a temperature above melting point for 1~3 min and thermostamped under a compressive pressure of 1000~4000 psi in the mold. The mold is unloaded for 1~2 min. to cool the part to ambient temperature.

Comparison of weight between conventional aluminum and carbon fiber reinforced polymer composites of this invention shows the lightweight and superior strength of continuous carbon fiber reinforced thermoplastics (such as PA6,6) used for the transit case assembly 10. The density of this material is approximately 0.059 lbs./in$^3$, which is much less than that of aluminum (0.097 lbs/in$^3$). The thickness of the continuous carbon fiber reinforced thermoplastics will be in the range of 0.5~3 mm. Since continuous carbon fiber reinforced composite materials exceed the structural properties of aluminum in the same thickness, case component thickness is decreased thereby reducing the weight even further. This translates to nearly a 50% weight savings over aluminum while providing far greater design flexibility, sophistication and substantially increasing the structural rigidity of the present invention. Compared with conventional roto-molded or glass-mat thermoplastic competitors' cases where the case wall thickness is up to 0.25", the present invention provides still greater weight reductions.

Two Stage Air and Water-Tight Latch

Figure 3A:
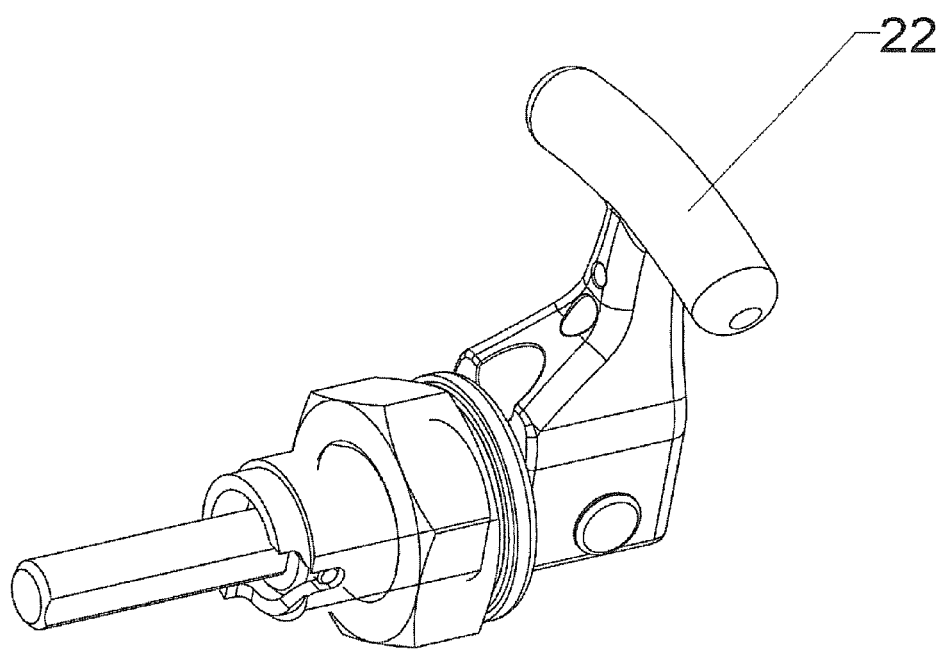
FIG. 3a is a perspective view of the cover latch 22 of FIG. 1.
Figure 3B:
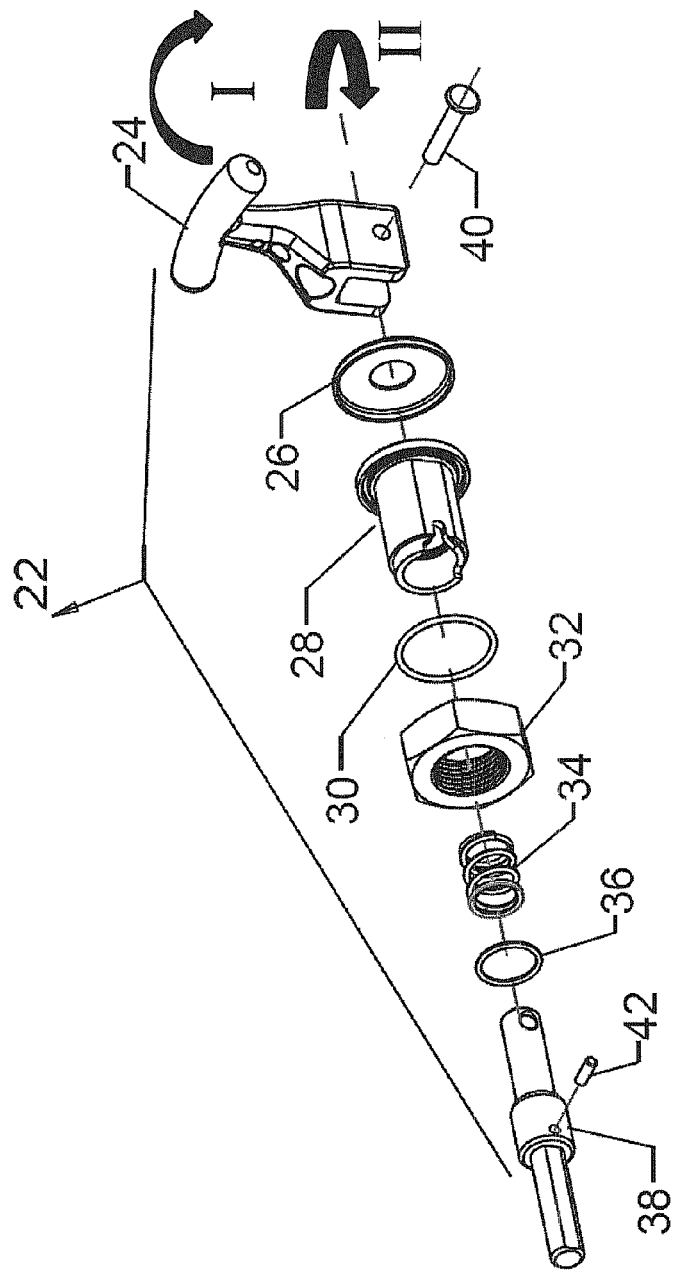

The present invention takes advantage of the construction of a recessed cup 44 and the two-stage positive latch 22. The latch 22 is uniquely implemented to accommodate hands even wearing chemical gloves. The recessed latch 22 permits rapid opening of case assembly 10 and also rapid reinstallation and resealing of each cover 14 to the case body 12. The cover latch 22, as shown in FIG. 2a, sits flush when not in use with no sharp edges capable of cutting or snagging a passerby. FIG. 3b is the exploded view of the latch 22 and comprises a T-handle 24 made of aluminum, a latch pin 42, a latch sleeve 28, a spring 34 coupled to a sleeve 28, a latch cap 26, a hex nut 32, a latch rivet 40, and a latch pin 42. The latch pin 42 traverses through other lathe parts and inserts into T-handle 24. The O-ring 36 is used to conform to the space between the latch pin 42 and latch sleeve 28 to provide sealing between the two components. O-ring 30 is also coupled to the end of the latch cap 26 providing tight sealing arrangement between the nut 32 and cap 26. During practical application, the T-handles 24 are deployed by rotation outward 90° (step I in FIG. 3b), and swiveling on axis 90° (step II in FIG. 3b), then they automatically simultaneously rotate the cam 46 out of the way thereby releasing the cover 14 from the case body 12.

Cover Parting Bracket and Parting Blade

Figure 4A:
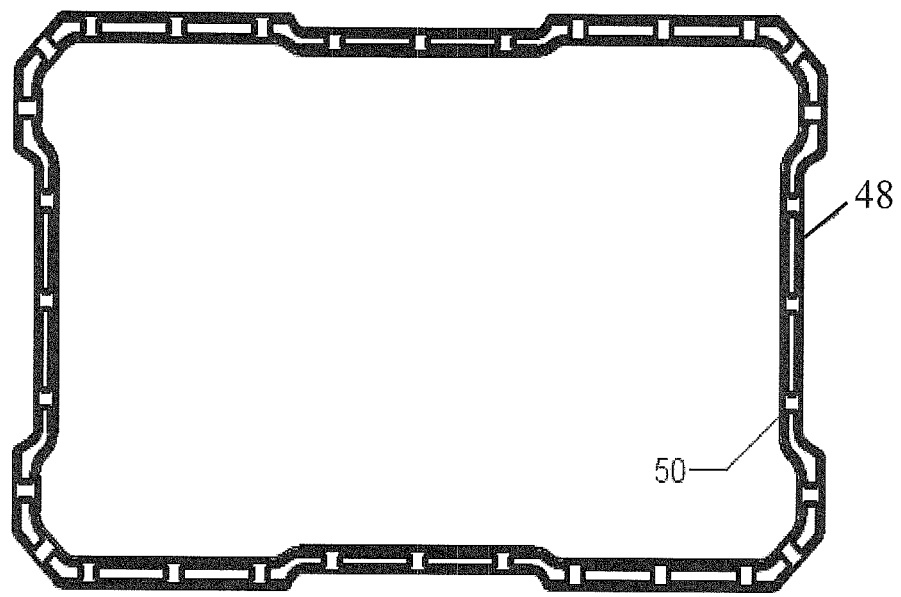
Figure 4B:
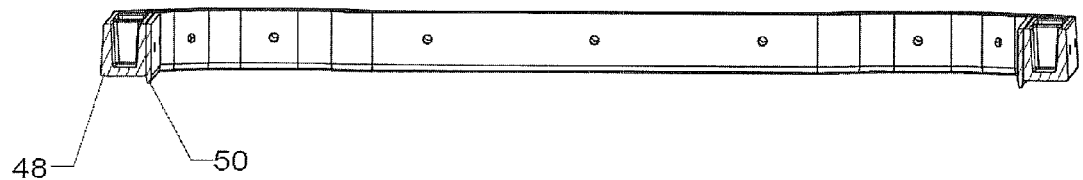

The cover parting bracket 48 and parting blade 50 are shown in FIGS. 4a and b. The cover parting bracket 48, made of glass fiber reinforced PA-6 composite material by compression mold techniques, is tightly connected against the inner side surface of the cover 14, as shown in FIG. 1. The inner surface of the cover parting bracket 48 is recessed on a vertical portion for reduction of the weight, as shown in FIG. 4a. In order to establish the sealing engagement between the cover 14 and case body 12, a bracket blade 50, made of aluminum, is connected to the cover parting bracket 48 (as will be further described below). A plurality of rivets is used to hold the cover parting bracket 48 and the bracket blade 50 together attached to the periphery of cover panel 54. This engagement of the formation of cover parting acts to keep the case body 12 and cover 14 in closure relationship so that the transit case can be sealed in water-tight and also air-tight engagement during practical applications.

Case Body

Figure 5:
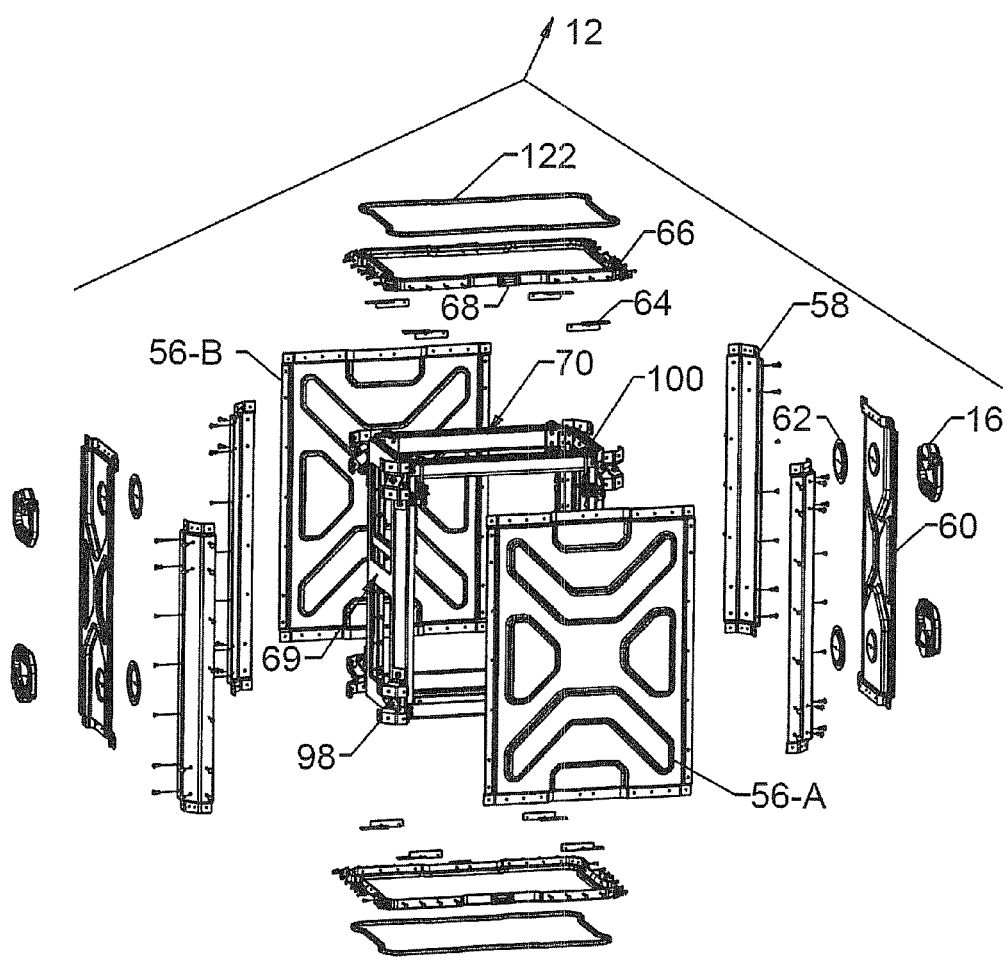
FIG. 5 shows an exploded view of the case body 12 of the ruggedized composite rack mount transport case.
Figure 6B:
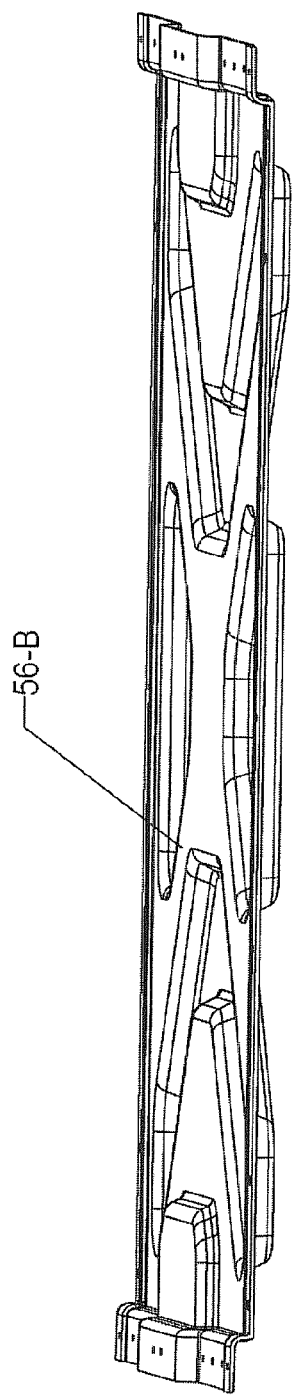
FIG. 6b is a perspective view of panel 56-B.

In FIG. 5, the case body 12 is formed of panels 56 A and B, side panels 60, four corner panels 58 and case body parting bracket 66, gasket 122, parting guides 68, chassis 69, and removable rack mount frame assembly 70. It is an important aspect of the present invention that the ruggedized case assembly 10 is capable of stacking one case assembly atop of another case assembly. The top and bottom surfaces (panel 56 A and B) of the case body 12 as shown in FIGS. 6a and 6b, have molded male and female features that allow stackability of ruggedized composite rack mount cases, which could prevent side-to-side slippage between the two cases in all directions.

Ergonomically Designed Handle

Figure 7A:
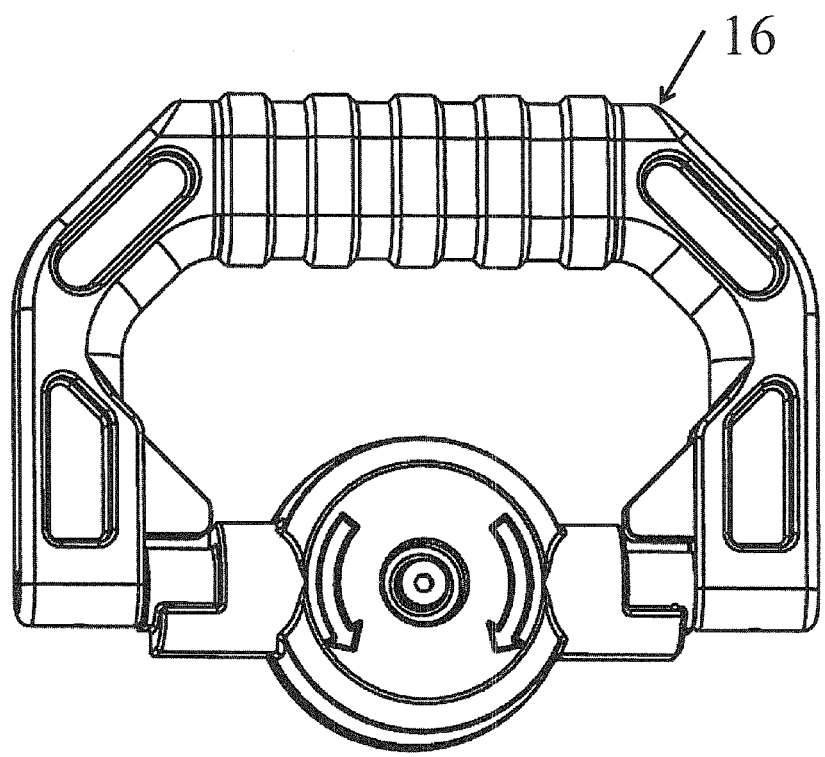
FIG. 7a is a front perspective view of the case handle 16.
Figure 7B:
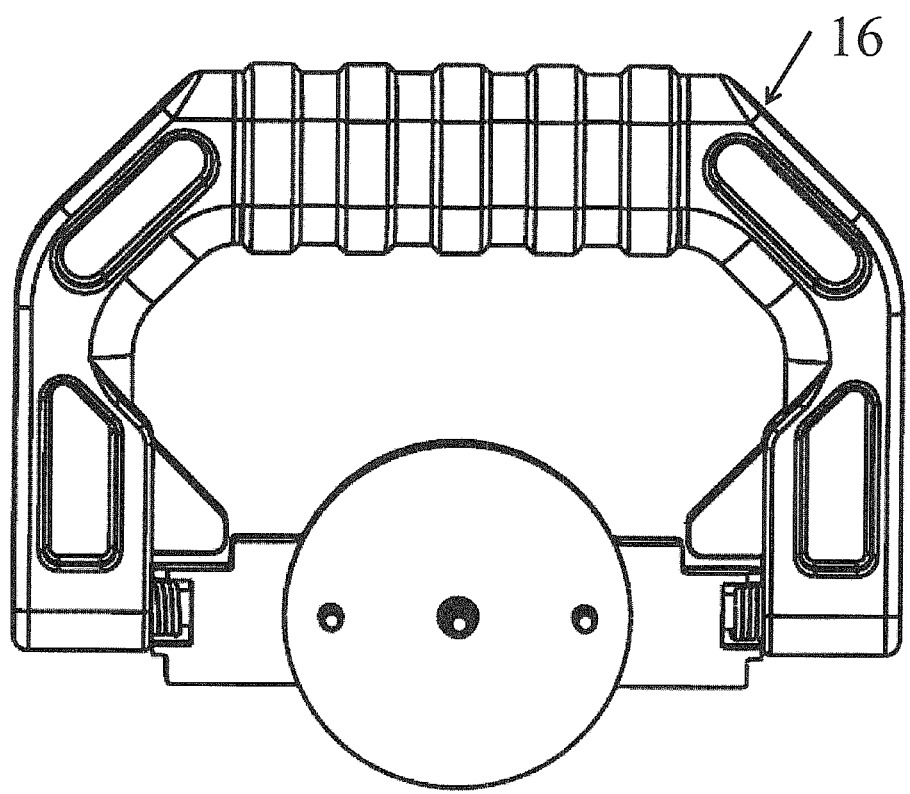
FIG. 7b is a rear perspective view of the case handle 16.
Figure 7C:
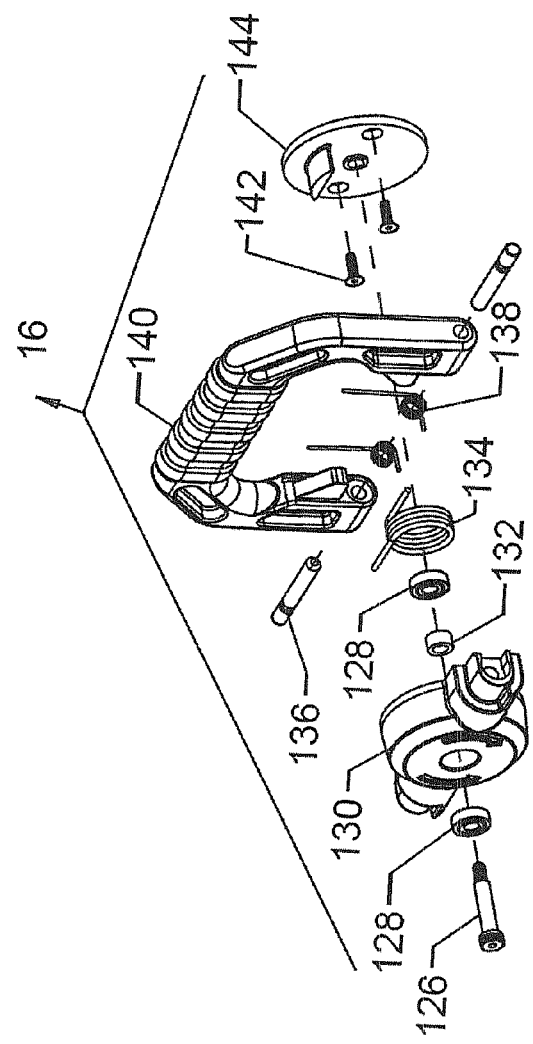
FIG. 7c is an exploded perspective view of the handle 16.

Referring to FIGS. 7a to 7c, two handles 16 for pulling or carrying the case are located on each of the two side panels 60 and recessed below the exterior surface. This is another important aspect of the present invention that the handles 16 are spring loaded and ergonomically designed and will swivel on axis up to 180° and rotate outward from a flush recess to a 90° position, automatically rotating back into a home position once released from use.

Figure 8A:
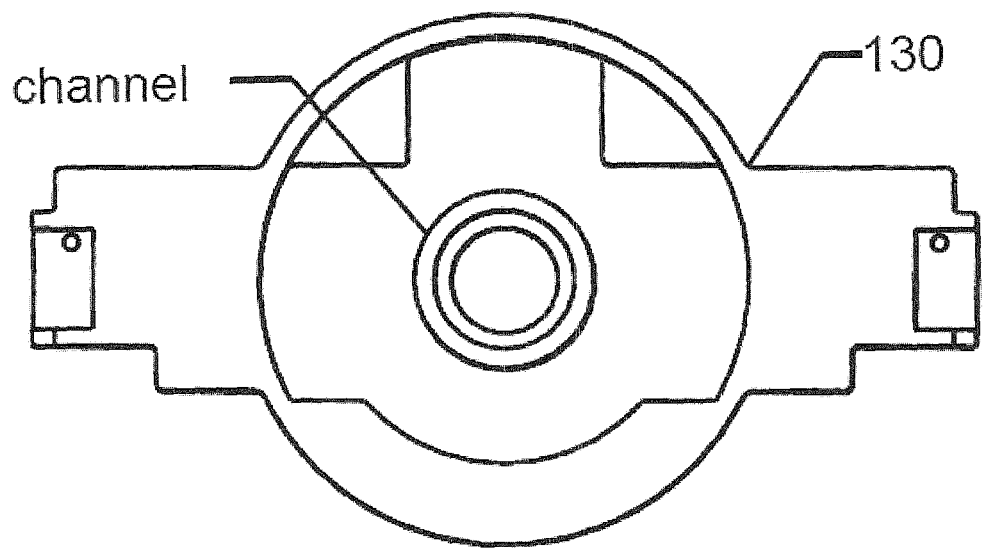
FIG. 8a is a plan view of rotary housing 130 of case handle 16.
Figure 8B:
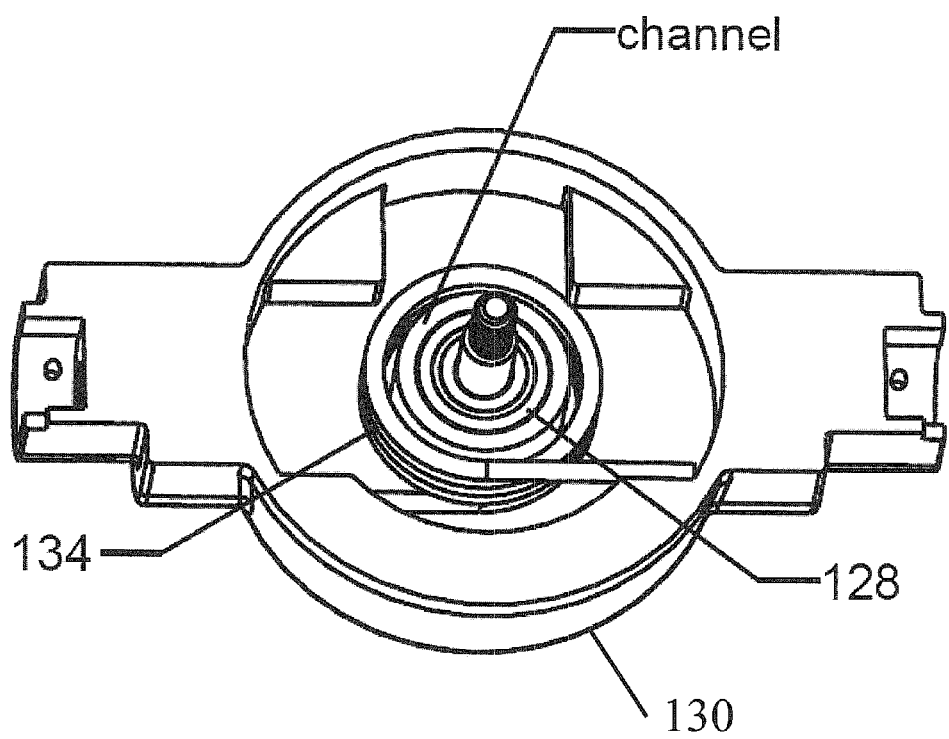

The handle 16 includes a center 140 made of aluminum, rotary housing 130, spring 134, handle base 144, two sealed cartridge bearings 128 and ferrule 132. The rotary housing 130 is made of aluminum with a channel (different diameters) located at the center of the housing, as shown in FIG. 8a. The ferrule 132 is inserted into the central portion of the channel and two sealed cartridge bearings 128 are symmetrically inserted into the channel from both sides, and then the spring 134 is attached on the channel of rotary housing 130 as shown in FIG. 8b.

A long rivet 136 attached with a small spring 138 is recessed into handle 16 center 140, which is used to hold the rotary housing 130 and 140 in mating engagement (see FIG. 7c). This construction will allow the handle 16 to rotate outward from a flush recess to 90° position, and automatically rotate back into a home or at rest position. The handle base 144 is firmly secure to the panel 60 by two threaded screws. Two Hex nuts are tightly locked on the end of the threaded screws preferably against the plate 62. A threaded fastener 126 traverses through the ferrule 132 and the cartridge bearing 128 through which the handle 16 is pivotally mounted to the panel 60. A Hex nut is lockingly engaged onto the end of the threaded fastener 126 preferably against a plate 62 for more uniform compression as shown in FIG. 5. The handle 16 is allowed to swivel on axis of up to 180°.

Case Body Parting Bracket and Gasket

Figure 9A:
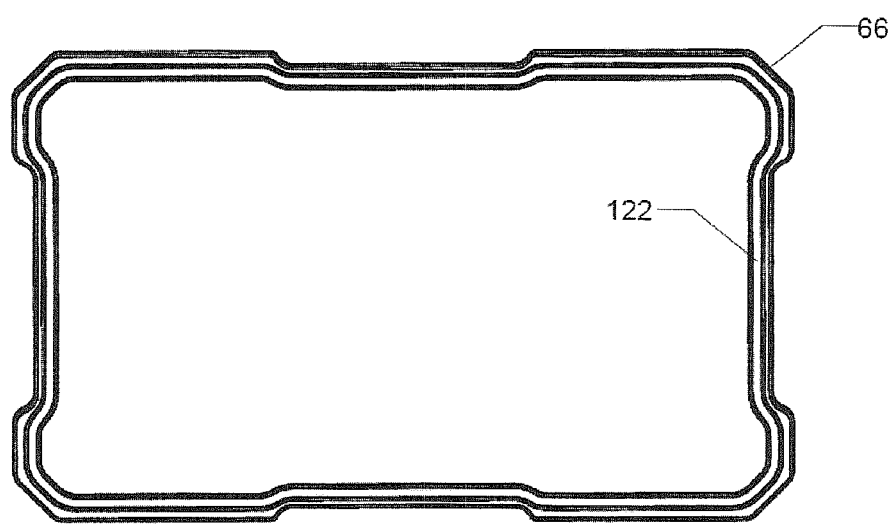
FIG. 9a is a plan view of the parting bracket 66 and gasket 122 of case body.

Turning now to FIGS. 9a to 9c, the case body parting bracket 66 and gasket 122 are shown. The case body parting bracket 66, made of continuous carbon fiber reinforced PA 6 polymer composite, is connected around the ends of the surrounding panels (wall) of the case body 12 utilizing rivets. Two functions are afforded by the case body parting bracket 66: to strengthen the case construction and provide enhanced impact resistance and durability during rough shipping and handling. Another function is to allow the case body 12 to effectively accommodate the cover 14. In order to further strengthen the construction, eight parting guides 68 (FIG. 10*b*), made of UHMW polyethylene are affixed at four corners and middle of the case body parting bracket 66.

Figures 10A, 10B:
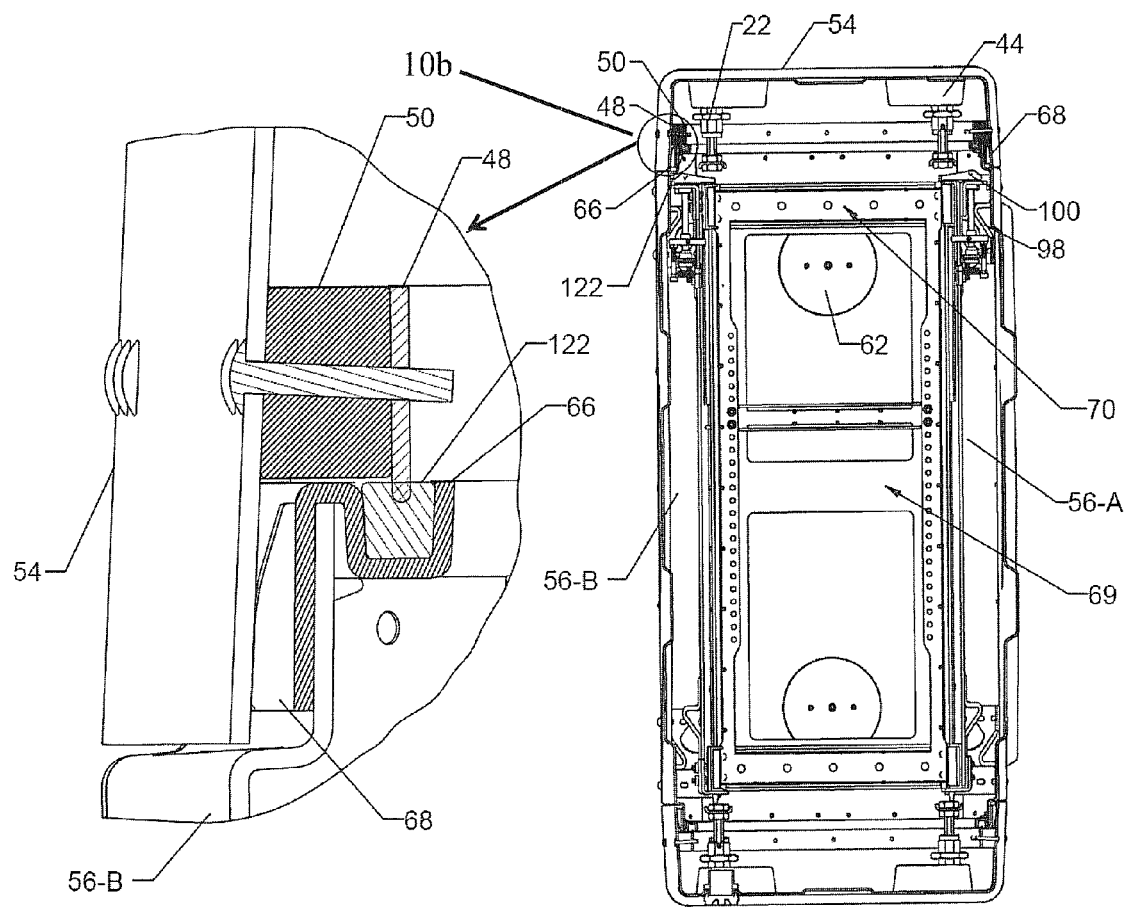

In order to establish secure sealing contact between the case body 12 and each cover 14, a rubber gasket 122 is shaped to conform tightly within the slot of the case body parting bracket 66, as shown in FIGS. 9*c* and 10*b*. The thickness and width of the gasket 122 are precisely consistent with the thickness and width of the slot of the case body parting bracket 66, respectively.

When the cover 14 is assembled to the case body 12, the cover parting blade 50 of the parting bracket 48 aligns with, and compresses the gasket 122 of the case body parting bracket 66 as shown in FIGS. 10*a* and 10*b*. This engagement acts to keep the body 12 and cover 14 in a sealed closure relationship so that the transit case 10 can be kept in sealed water-tight and air-tight engagement to provide protection to the electric equipment from moisture, salt spray, dust, oils, solvents and other military environments.

Removable Rack Mount Frame

Figures 11A, 11B, 11C:
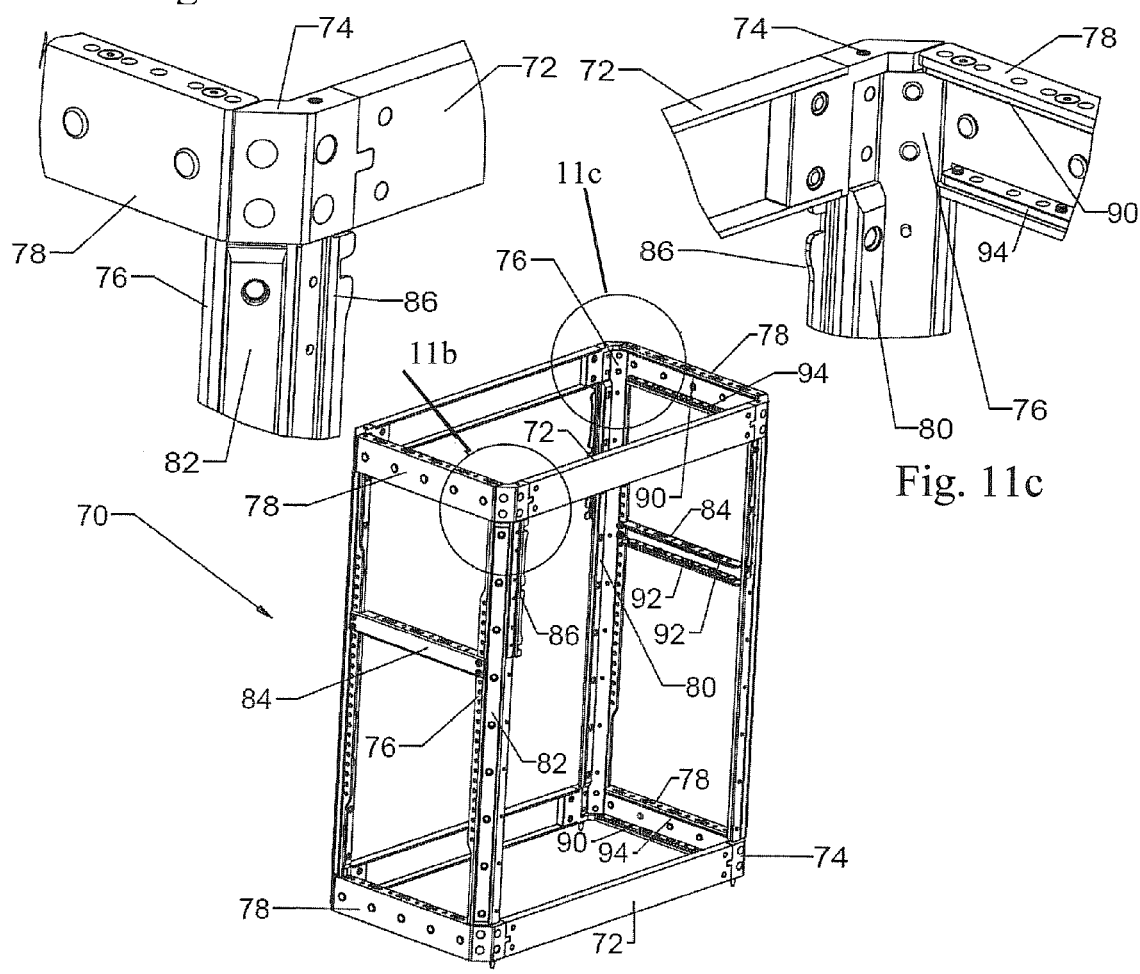

FIGS. 11 *a-d* illustrate the removable rack mount frame 70 which is constructed of aluminum and preferably rectangular in shape in order to be accommodated within the similarly-shaped case 10. It can be seen from FIG. 11*a* that the rack mount frame 70 includes four frame members 72, eight corner joints 74 and two frame side members 76 having a horizontal portion and a vertical portion. The ends of each U-shaped member 72 and frame side members 76 are connected together by a corner joint 74, which is made of machined aluminum. The corner joint 74 is inserted into frame member 72 (see FIGS. 11*b* and 11*c*). In order to further strengthen the construction, four countersunk rivets pass through the unthreaded holes of the corner joint 74 and through four aligned unthreaded holes of the frame side member 76. Two countersunk rivets pass through the unthreaded holes of the U-shaped member 72 and through the aligned holes of the corner joint 74 as shown in FIGS. 11*b* and 11*c*.

Figure 11D:
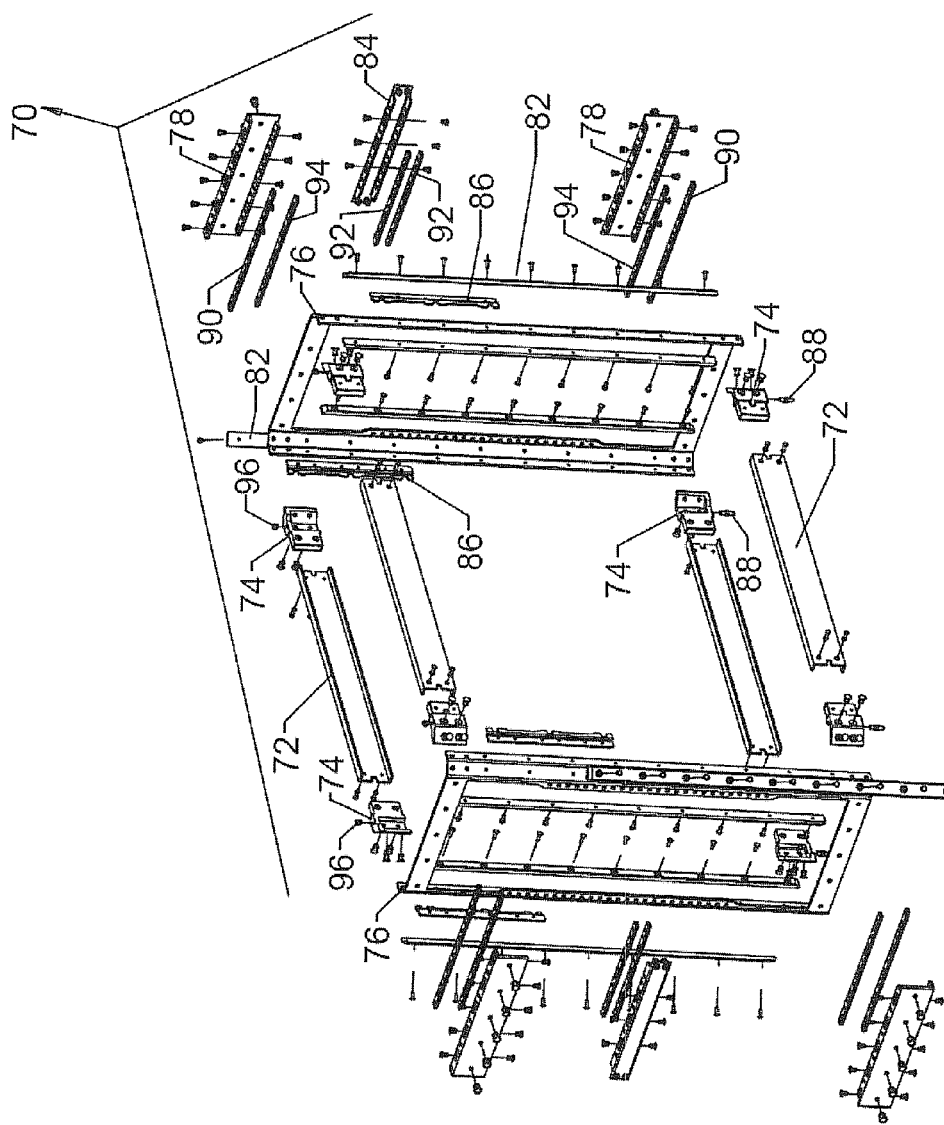

As illustrated in FIGS. 11*b*, 11*c* and 11*d*, C-channel mounting rails 78 are attached on the horizontal portion of frame side member 76. The C-channel mounting rail 78 has two flanges with different lengths with the longer flange being positioned on the outer surface of the horizontal portion of frame side member 76. Five rivets pass through the unthreaded holes of the C-channel rail 78 in the horizontal direction and then pass through the aligned holes of the horizontal portion of frame side member 76 to firmly secure the C-channel rail 78 to the frame side member 76.

Two steel plates 90 and 94 with different lengths are correspondingly positioned on the inner surface of the two flanges of the C-channel rail 78, respectively. Two threaded holes with different diameters are drilled on the surface of each steel plate 90 and 94. The small size holes are used to secure the steel plate to the C-channel rail 78. The spacing between adjacent parallel holes on each steel plate 90 or 94 is equal to the spacing between adjacent parallel holes on the corresponding flange of the C-channel rail 78. Five screws pass through the holes on the outer surface of the flange of C-channel rail 78 in the vertical direction and thread into the aligned holes on each steel plate 90 and 94, which secures the steel plates 90 and 94 to the corresponding C-channel flange. The advantageous cooperation between C-channel rail 78 and steel plates 90 and 94 secures the front bezel panel of electronic equipment and modules to the removable rack mount frame 70.

In addition, the present invention preferably provides an adjustable advantage for the attached electric equipment and modules. An adjustable mounting rail 84 is positioned intermediate to each frame side member 76, as shown in FIG. 11*a*. Two threaded fasteners pass through the unthreaded holes at the end of each mounting rail 84 and through the aligned unthreaded holes on the vertical portion of frame side member 76. A hexagonal nut is lockingly engaged onto the end of the threaded screw for securing the mounting rail 84 to the vertical portion of frame side member 76. Each adjustable mounting rail 84 can be positioned as desired lengthwise of the frame side member 76 to allow for the advantageous mounting of the electric equipment. This unique feature provides variable equipment mounting capabilities in accordance with the size of the electric equipment.

Four longitudinal slides 82, preferably made of UHM polyethylene, are symmetrically mounted on the outer surface of vertical portion of frame slide member 76 in a 45° orientation at the four corner locations as shown in FIGS. 11*b* and 11*c*. The rack mount frame 70 is slidable and removable, slides 82 serving to facilitate the smooth sliding movement of the removable rack mount frame 70 into, and out of the case 10. In FIG. 11*d*, it can be seen that the slides 80 are also symmetrically mounted on the inner surface of the vertical portion of frame slide side 76. Each slide 82 is located at the corner and closely connected to U-shaped members 72, which facilitates the sliding of the electric equipment into and out of the removable frame 70. As seen in FIG. 11*d*, four pins 88 are inserted into alignment holes of each corner joint 74. When the removable frame 70 is slid into the chassis 69, the pins 88 will insert into aligned holes in the chassis 69 for additional alignment accuracy and stability.

Lock Mechanism for Removable Rack Mount Frame

Figure 12:
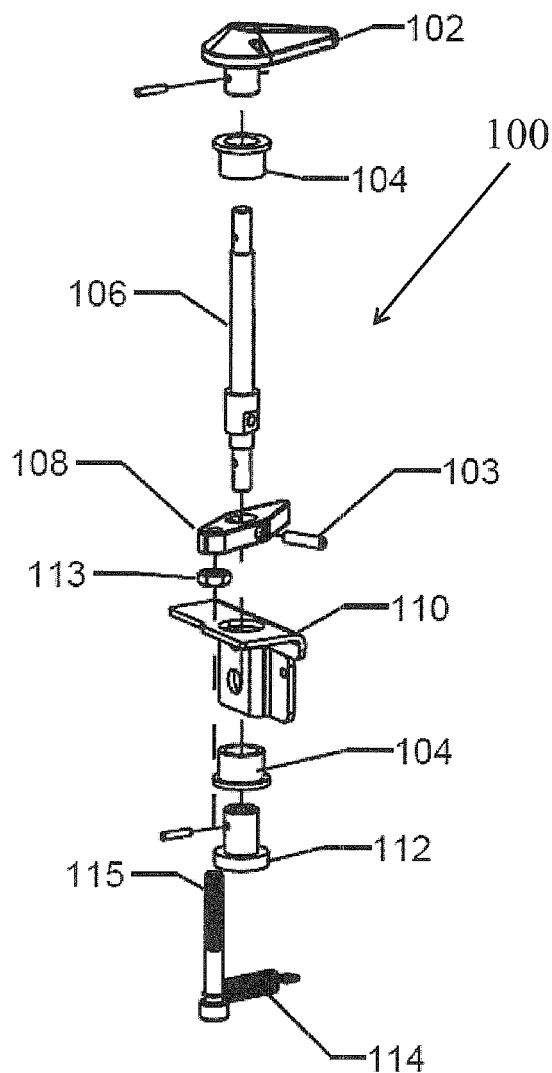
FIG. 12 is an exploded perspective view of lock mechanism 100.
Figure 13:
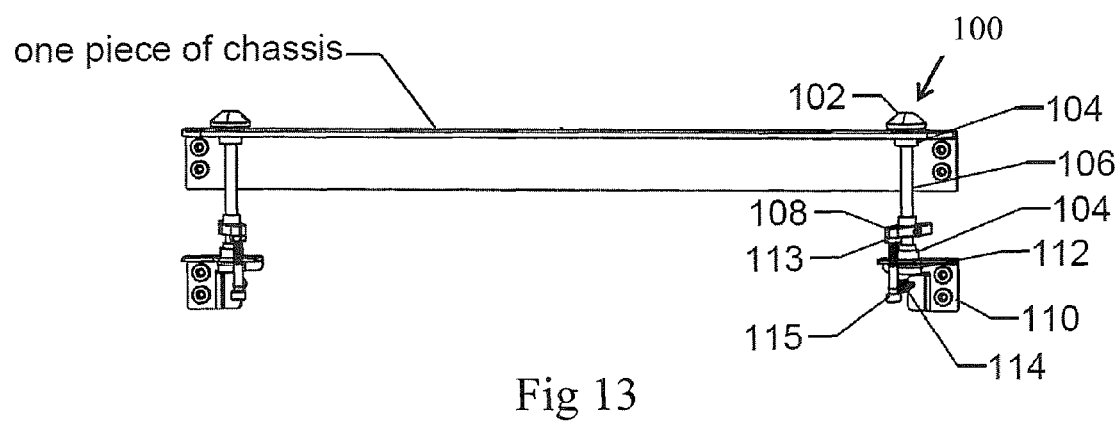
FIG. 13 shows lock mechanism 100 attached to each end of one piece of chassis 69.

The lock mechanism 100 is a unique design in the present invention. It comprises lever 102, two flange sleeves 104, locker shaft 106, locker 108, locking flange 112, pivot bracket lock 110, as shown in FIGS. 12 and 13. The locker 108 is tightly mounted to the locker shaft 106 through pin 103. Each end of locker shaft 106 is inserted into the lever 102 and locking flange 112, respectively, and each end is fixed by another pin. The flange sleeve 104 is coupled to the locking flange 112 and lever 102, respectively, and extend through the hole on the pivot bracket lock 110, whereby the pivot bracket lock 110 is attached to the locker shaft 106. An extension spring 114 is attached to the lock mechanism through a hole on the pivot bracket lock 110 and the threaded fastener 115, which are screwed into the hole on the locker 108. A jam-nut 113 is engaged onto the threaded fastener 115 preferably against the locker 108 which is used to control longitudinal positioning of locker 108. The lock mechanism 100 is mounted to the chassis 69 by the pivot bracket lock 110 by two screws which secure the lock mechanism 100 to the chassis 69. Meanwhile, the locker shaft 106 of lock mechanism also traverses through the hole on the edge of chassis 69 as shown in FIG. 13.

Four stop brackets 86, as shown in FIGS. 11*b* and 11*c*, are connected to the outer surface of the vertical portion of frame side member 76. Multiple positions are provided by each of four stop brackets 86 and serve to selectively accommodate the lock mechanism 100 as will be described below.

FIGS. 14 *a-d* show the chassis 69, removable rack mount frame 70, and lock mechanism 100. The removable rack frame 70 is retained in chassis 69 by the four lock mechanisms 100 by the interaction between the stop bracket 86 and locker 110 of lock mechanism 100. The lock mechanism 100, as shown in FIGS. 14b and 14c, can be rotated 90° in the direction of arrow A releasing (or relocking) the removable rack mount frame 70 from the chassis 69 (see FIG. 14 d). Meanwhile, the stop bracket 86 connected to the removable rack mount frame 70 has multiple indexed positions via the interaction between the stop bracket 86 and locker 108 of each lock mechanism 100. The lock mechanisms 100 secure the removable rack mount frame 70 to the chassis 69 during shipping or handling of the case 10 and also prevent the removable rack mount frame 70 from any destructive movement when the case 10 is dropped, or suffers some other type of impact, incident force, or the like. With one cover 14 removed, the suspended electronic equipment is accessible without complete removal of the removable rack mount frame 70 from the case 10, thereby permitting the user to pack, unpack or manipulate the electric equipment within the removable frame 70 without the interference caused by case 10.

Vibration/Shock Absorbers

As best seen in FIGS. 14c, 14d and 15, vibration/shock absorbers 98 are symmetrically mounted between the outer corners of the chassis 69 and the inner corners of the case body 12 in a 45° orientation. The vibration/shock absorber 98 is made of aluminum having two shock absorber brackets 99 and 101 and isolator 103 as shown in FIG. 15. The shock absorber brackets 99 and 101 are mounted to panel 58 and the chassis 69, respectively, which will secure the chassis 69 to the case body 12 during the transportation of the case body 12 and also provide shock and vibration attenuation during corner drop testing and practical application.

In the preferred embodiment, eight (8) vibration/shock absorbers 98 are symmetrically mounted between the outer chassis 69 and the surrounding panels of the ruggedized composite case 10 in a 45° orientation as previously described and provide shock and vibration attenuation for electronic equipment of all types. However, in another embodiment, the case may be provided without vibration/shock absorbers 98. The chassis 69 will be directly mounted onto the surrounding panels of case body 12 through fasteners.

EMI/RFI Shielding

Electromagnetic interference shielding (EMI) and radio frequency interference (RFI) may cause malfunctions in electronic devices in a ruggedized composite rack mount transport case. In order to prevent EMI or RFI, EMI/RFI shielding agents may be employed and will be coated on the interior surface of the surrounding panels 56A, 56B and 60 and corners 14 of the case 10 through thermoforming/stamping techniques, which will reduce or completely eliminate EMI and RFI interference. The EMI/RFI shielding agents may be selected from the group including metal mesh or foil including copper, nickel and silver; copper or nickel coated carbon fiber or glass fiber, and combinations thereof.

Many advantages of the present invention can be clearly seen from the preferred embodiments described. It will be understood by those skills in the art that various modifications may be made within the scope of the invention. Therefore, it is intended that the invention is not be limited to the particular embodiments disclosed, but that the invention includes all embodiments falling within the scope of the appended claims.

While a number of exemplary aspects and embodiments have been discussed above, those of skill in the art will recognize certain modifications, permutations and additions and subcombinations thereof. It is therefore intended that the following appended claims and claims hereinafter introduced are interpreted to include all such modifications, permutations, additions and subcombinations that are within their true spirit and scope.

The invention claimed is:

1. A ruggedized transport case assembly comprising:
    a rectangular hollow case body formed of a plurality of panels in mating edge engagement and having open ends thereof;
    a removable cover closely sealingly releasably connected to each end of said case body;
    a plurality of cover latches each rotatably secured in recessed cups in each said cover for releasably securing said covers and said case body together to form a closed interior of said case assembly;
    each said cover latch including a T-handle being deployed by rotation outwardly and then swiveling of the T-handle axially to simultaneously rotate a cam to release said latch;
    a plurality of recessed handles each connected to one said panel for pulling and carrying said case.

2. A ruggedized transport case assembly as set forth in claim 1, wherein:
    said panels and said cover are formed of embossed continuous fiber reinforced polyamide 6,6 composite having a thickness in a range of 0.5-3.0 mm.

3. A ruggedized transport case assembly as set forth in claim 1, wherein:
    said composite is formed from a combination of continuous carbon fiber and carbon fiber reinforced thermoplastic.

4. A ruggedized transport case assembly as set forth in claim 1, wherein:
    each said handle is rotatable outwardly to a position orthogonal to said panel and swivelable against bias springs which automatically return said handle to an at rest non-use position recessed within an exterior surface profile of said panel.

5. A ruggedized rack mount transport case assembly comprising:
    an open-ended rectangular hollow case body including a plurality of panels formed of composite material connected together in edge-to-edge mating engagement;
    two removable covers each formed of a composite material and being closely sealingly releasably connected to each open end of said case body;
    a plurality of cover latches each rotatably secured in a recessed cup in each said cover for releasably securing each said cover and said case body together to form a closed interior of said case;
    each said cover latch including a T-handle deployed by rotation outwardly and then swiveling the T-handle axially to simultaneously rotate a cam to release said latch;
    a plurality of recessed handles each connected to one said panel for pulling and carrying said case assembly;
    a rigid cover parting bracket having a U-shaped open central portion connected to and extending entirely around a periphery of said cover and having a rigid parting blade extending around and against a surface of said cover parting bracket;
    a case body parting bracket connected to, and extending entirely around, a periphery of each end of said case body, each said case body parting bracket including a compressible sealing gasket positioned within an open V-shaped central portion of said case body parting bracket;
    each said parting blade being aligned with and sealingly compressing one said sealing gasket;

a chassis supportively mounted within, and generally coextensive with, said case body;

a removable rack mount frame slidably supported in said chassis, said rack mount frame for supportively securing electronic component therein;

a stop bracket connected to each corner of one end of said rack mount frame opposing a lock mechanism connected to each corner of one end of said chassis and having a plurality of spaced notches formed into said stop bracket for selective incremental locking positioning of said rack mount frame in said chassis.

6. A ruggedized rack mount transport case assembly as set forth in claim 5, wherein:

said panels and said cover are formed of embossed continuous fiber reinforced polyamide 6,6 composite having a thickness in a range of 0.5-3.0 mm.

7. A ruggedized rack mount transport case assembly as set forth in claim 6, wherein:

said composite is formed from a combination of continuous carbon fiber and carbon fiber reinforced thermoplastic.

8. A ruggedized rack mount transport case assembly as set forth in claim 6, wherein:

each said handle is rotatable outwardly to a position orthogonal to said panel and swivelable against bias springs which automatically return said handle to an at rest non-use position recessed within an exterior surface profile of said panel.

9. A ruggedized rack mount transport case assembly as set forth in claim 6, wherein:

a plurality of vibration/shock absorbers each connected between an outer corner of said chassis and an inside corner of said case body;

each said vibration/shock absorber being oriented at an angle of 45° to all orthogonal panel surfaces of said case body.

10. A ruggedized rack mount transport case assembly comprising:

an open-ended rectangular hollow case body including a plurality of panels formed of composite material connected together in edge-to-edge mating engagement;

two removable covers each formed of a composite material and being closely sealingly releasably connected to each open end of said case body;

a plurality of cover latches each rotatably secured in a recessed cup in each said cover for releasably securing each said cover and said case body together to form a closed interior of said case;

each said cover latch including a T-handle deployed by rotation outwardly and then swiveling the T-handle axially to simultaneously rotate a cam to release said latch;

a plurality of recessed handles each connected to one said panel for pulling and carrying said case assembly;

a rigid cover parting bracket having a U-shaped open central portion connected to and extending entirely around a periphery of said cover and having a rigid parting blade extending around and against a surface of said cover parting bracket;

a case body parting bracket connected to, and extending entirely around, a periphery of each end of said case body, each said case body parting bracket including a compressible sealing gasket positioned within an open V-shaped central portion of said case body parting bracket;

each said parting blade being aligned with and sealingly compressing one said sealing gasket;

a chassis supportively mounted within, and generally coextensive with, said case body;

a removable rack mount frame slidably supported in said chassis, said rack mount frame for supportively securing electronic component therein;

a stop bracket connected to each corner of one end of said rack mount frame opposing a lock mechanism connected to each corner of one end of said chassis and having a plurality of spaced notches formed into said stop bracket for selective incremental locking positioning of said rack mount frame in said chassis;

said panels and said cover are formed of embossed continuous fiber reinforced polyamide 6,6 composite having a thickness in a range of 0.5-3.0 mm;

each said handle being rotatable outwardly to a position orthogonal to said panel and swivelable against bias springs which automatically return said handle to an at rest non-use position recessed within an exterior surface profile of said panel;

a plurality of vibration/shock absorbers each connected between an outer corner of said chassis and an inside corner of said case body;

each said vibration/shock absorber being oriented at an angle of 45° to all orthogonal panel surfaces of said case body.

* * * * *